United States Patent [19] [11] 3,813,582
Gikow [45] May 28, 1974

[54] PRINTED CIRCUIT BOARD VIBRATION SNUBBER

[75] Inventor: Emanuel Gikow, West Long Branch, N.J.

[73] Assignee: The United States of America as represented by the Secretary of the Army, Washington, D.C.

[22] Filed: Apr. 3, 1973

[21] Appl. No.: 347,603

[52] U.S. Cl. .......................... 317/101 DH, 188/1 B
[51] Int. Cl. .......................... H02b 1/02
[58] Field of Search... 317/101 DH, 101 CB, 101 D, 317/101 CM; 188/1 B; 211/41

[56] References Cited

UNITED STATES PATENTS

| | | | |
|---|---|---|---|
| 3,131,330 | 4/1964 | Allen | 317/101 DH |
| 3,688,635 | 9/1972 | Fegen | 317/101 CC |

*Primary Examiner*—David Smith, Jr.
*Attorney, Agent, or Firm*—Edward J. Kelly; Herbert Berl; Arthur L. Bowers

[57] ABSTRACT

A printed circuit board that removably plugs into a metal chassis compartment and which supports circuitry whose performance is degraded if the circuit board vibrates in place in the chassis compartment and which is stiffened by a cemented-on backing to resist vibration, and which is nonrepairable due to the presence of the cemented backing, is improved by rendering the cemented-on backing excess through the addition of vibration snubber means in the form of at least one pin that projects through a perforation in the circuit board and is soldered to grounded metal cladding on one face of the circuit board, near its edge opposite that edge along which is mounted the plug-in terminals carried by the circuit board, the pin being designed to firmly abut the opposed partitions of the compartment in which the circuit board is nested.

3 Claims, 3 Drawing Figures

PATENTED MAY 28 1974 3,813,582

PRINTED CIRCUIT BOARD VIBRATION SNUBBER

BACKGROUND OF THE INVENTION

Circuit board cards are designed to nest in compartments of a chassis. The chassis is provided with side walls and partitions that extend between the side walls and delimit the compartments; two side walls have guideways for the opposed side edges of the cards. End plates are fastened transverse to the ends of the side walls. A series of plug-in terminals are secured alongside a third edge of the card and a terminal receptacle means is mounted in each compartment on an end plate. When the circuit board card is nested in the compartment with its side edges in the respective guideways and with the plug-in terminals seated in the terminal receptable means in that compartment, the fourth edge, i.e., the edge opposite the one that supports the plug-in terminals and a substantial area of the circuit board card can be caused to vibrate relative to the compartment partitions of the chassis. Vibration occurs when the equipment is transported by a land vehicle or an aircraft or is seated on any vibrating platform. Where the card supports a voltage controlled oscillator or another circuit whose performance is degraded by such vibration, the card has been rendered vibration resistant by bonding stiffening laminae of plastic and of metal to one face of the board. However, such stiffening laminae precluded repair that might otherwise be made were the stiffening laminae not present because essentially all connections were sealed under the laminae. Not only is repair of the equipment in the field made impossible except by substitution of a replacement card, but high cost is inherent in replacing any expensive circuit board cards to correct circuit faults on the card. Also, it is not uncommon to find one or more faults in a card at the end of an assembly line even before the card is used in an equipment; rejects add considerably to the equipment cost.

DESCRIPTION OF THE PREFERRED EMBODIMENT

Figure 1:
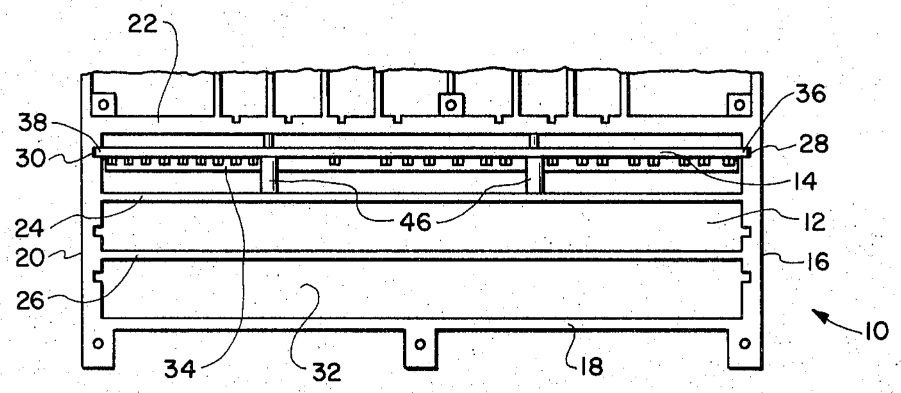
FIG. 1 is a top view of part of a circuit board chassis, and with a circuit board modified according to this invention in place in a compartment of the chassis, but excluding all components and connections.

In FIG. 1, there is shown a chassis 10 having compartments 12 and a circuit board 14 nested in one compartment. The chassis includes rigid side walls 16, 18, 20 and 22. Parallel partitions 24, 26 are affixed to and extend between side walls 16, 20. The side walls 18 and 22 also function as partitions. Recessed guideway channels 28, 30 are formed in the opposed side walls 16, 20 and extend across the entire transverse dimension of those walls. The channels and the partitions are parallel and there are equal spacings between channels at opposite ends of a compartment and the respective compartment partitions. Because tall circuit components, not shown, are mounted on one face of the card, the card is not centered between partitions. An end plate 32 is fastened normal to the rigid walls; a second end plate may be fastened to the other end of the rigid walls. Conventional plug-in receptacle terminal means 34 is mounted on end plate 32 for each compartment. Wiring for the terminal elements of the receptacle is omitted. The width of the channels 28 is designed for snugly engaging the side edges 36, 38 of the circuit board and the depths of the channels are made so that there is no unnecessary play and to properly locate the circuit board card for plugging into the terminal receptacle means 34. The circuit board card plugged into terminal receptacle means in a compartment is firmly gripped on three edges.

Figure 2:
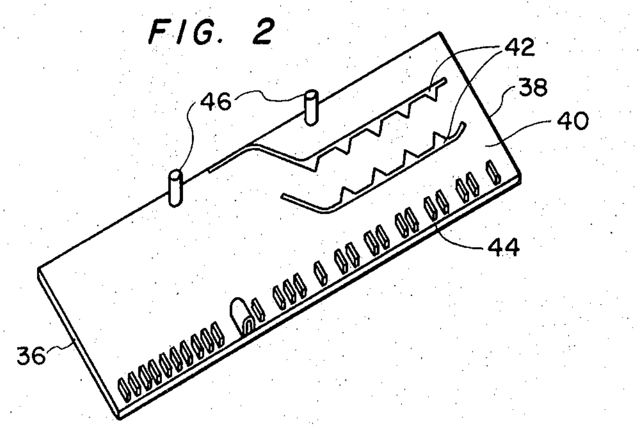
FIG. 2 is a plan view on a reduced scale of a circuit board shown in FIG. 1, including pins according to this invention, a terminal strip and some exemplary etched conductor but excluding all components and connections.

The circuit board 14 generally has a glass-loaded epoxy substrate 40; the blank is copper-clad on its opposed faces. The copper cladding on both faces is etched to form printed circuit segments such as 42. Circuit components, not shown, are mounted on that face seen in FIG. 2. Perforations, not shown, are formed in the circuit board for conductor connections that thread through the perforations and are soldered in place; on the face opposite the one shown, most of the cladding is retained and serves as circuit interconnections and as a common connection or ground.

Plug-in terminals 44 are fastened along one edge of the circuit board properly positioned for registration with the terminal receptacle means. Vibration snubber means 46 is secured along the edge of the circuit board remote from the terminal strip and projects transverse to each face of the circuit board; the length of the vibration snubber means measured from each face of the circuit board is designed to bear firmly against the respective partitions of the compartment in which the circuit board card nests.

Figure 3:
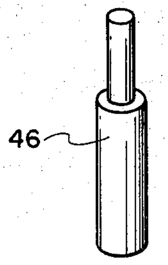
FIG. 3 is a perspective view on an enlarged scale of a pin that is mounted in the circuit board of FIG. 2.

One form of the vibration snubber used successfully is a pair of metal pins as shown in FIG. 3. They project through perforations in the circuit board and also project through and are soldered to the metal cladding on the reverse face, not shown, that serves as the electrical common. Alternatively, metal pins staked in place in the perforation may be used in lieu of the pins shown in FIG. 3. The vibration snubber has performed successfully to obviate the degraded performance of a voltage controlled oscillator caused by vibration of the circuit board card nested in place in its compartment and has rendered entirely unnecessary the previously used stiffening laminae.

Many modifcations and variations of the present invention obviously are possible in the light of the above disclosure. It is therefore to be understood, that within the scope of the appended claims, the invention may be practiced otherwise than as described specifically.

What is claimed is:

1. An electronic equipment comprising:

a chassis providing a compartment for nesting a circuit board, the compartment being bounded by two narrow side walls, two partitions extending between the narrow side walls, and an end plate that supports terminal receptacle means between the partitions, each of the narrow side walls having a guideway channel transverse to the end wall, the channels being parallel to the two partitions and being correspondingly spaced relative to the partitions, a circuit board for supporting a circuit subassembly of the equipment and having plug-in terminals along one edge thereof, said circuit board being nested in the compartment with its side edges in registration with the channels and its plug-in terminals plugged into the terminal receptacle means, and vibration snubber means secured to the circuit board near the edge opposite the terminal strip and in butting engagement with the two partitions.

2. An electronic equipment as defined in claim 1 wherein the circuit board has electrically conductive cladding distributed over a large part of a face of the circuit board, the circuit subassembly being sensitive to vibration of said circuit board in said chassis, said circuit board being formed with a perforation near the edge opposite the terminal strip, said vibration snubber means being a metal pin that projects through the perforation and soldered to the copper cladding.

3. In combination, a circuit board, plug-in terminals secured along one edge of the circuit board, said circuit board being formed with a perforation near the edge opposite the plug-in terminals and having electrically conductive cladding distributed over a large part of a face of the circuit board, and vibration snubber means consisting of a metal pin projecting through the perforation and soldered to the copper cladding, for continuous butting engagement with opposed partitions of a chassis compartment in which the circuit board is nested.

* * * * *